(12) United States Patent
Okada et al.

(10) Patent No.: US 7,197,191 B2
(45) Date of Patent: Mar. 27, 2007

(54) IMAGE TRANSFORMATION APPARATUS AND METHOD

(75) Inventors: Shigeyuki Okada, Oogaki (JP); Kazuhiko Taketa, Gifu (JP); Hideki Yamauchi, Oogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 750 days.

(21) Appl. No.: 10/390,909

(22) Filed: Mar. 19, 2003

(65) Prior Publication Data

US 2003/0190083 A1    Oct. 9, 2003

(30) Foreign Application Priority Data

Mar. 19, 2002    (JP)    ............... 2002-077357

(51) Int. Cl.
G06K 9/46    (2006.01)
G06K 9/36    (2006.01)
(52) U.S. Cl. .................................... 382/240
(58) Field of Classification Search ............... 382/190, 382/235, 240, 247, 260, 263, 264, 272, 276, 382/277, 295, 300, 305; 375/240.03, 240.19
See application file for complete search history.

(56) References Cited

U.S. PATENT DOCUMENTS

| | | | | |
|---|---|---|---|---|
| 6,125,210 | A * | 9/2000 | Yang | 382/240 |
| 6,236,757 | B1 * | 5/2001 | Zeng et al. | 382/240 |
| 6,577,770 | B1 * | 6/2003 | Martin et al. | 382/240 |
| 6,788,820 | B2 * | 9/2004 | Ammicht et al. | 382/240 |
| 6,922,491 | B2 * | 7/2005 | Yip | 382/260 |
| 7,031,404 | B2 * | 4/2006 | Lindquist | 375/316 |
| 7,031,536 | B2 * | 4/2006 | Kajiwara | 382/240 |
| 7,046,854 | B2 * | 5/2006 | Daniell | 382/235 |
| 2001/0033698 | A1 | 10/2001 | Yip | |
| 2002/0154826 | A1 * | 10/2002 | Okada | 382/240 |
| 2002/0181799 | A1 * | 12/2002 | Matsugu et al. | 382/260 |
| 2003/0138152 | A1 * | 7/2003 | Fenney | 382/240 |
| 2004/0042679 | A1 * | 3/2004 | Yamada | 382/260 |

FOREIGN PATENT DOCUMENTS

JP    2002-101310    5/2002

(Continued)

OTHER PUBLICATIONS

Japanese Office Action for Corresponding Japanese Patent Application No. JP 2002-077357, dispatched Jan. 10, 2006.

Primary Examiner—Amir Alavi
(74) Attorney, Agent, or Firm—McDermott Will & Emery LLP

(57) ABSTRACT

An SRAM is used as a pixel buffer which stores a partial image region copied from a frame buffer. A vertical filter reads a pair of target pixels arranged in a vertical direction from the pixel buffer and performs a filtering process of a discrete wavelet transform in the vertical direction. An intermediate result obtained in the filtering process is stored in a register. The vertical filter uses the intermediate result in filtering the next two pixels. A horizontal filter receives two transformed results from the vertical filter and performs a filtering process on the transformed results in the horizontal direction. The intermediate results obtained in the horizontal filtering are also stored in a register and utilized in the next filtering.

13 Claims, 8 Drawing Sheets

FOREIGN PATENT DOCUMENTS

| | | |
|---|---|---|
| JP | 2002-135780 | 5/2002 |
| JP | 2002-197075 | 7/2002 |
| JP | 2002-304624 | 10/2002 |
| JP | 2002-344969 | 11/2002 |
| JP | 2003-258646 | 9/2003 |

* cited by examiner

IMAGE TRANSFORMATION APPARATUS AND METHOD

BACKGROUND OF THE INVENTION

1. Field of the Invention

The present invention relates to an image transformation technology, and it particularly relates to method and apparatus for transforming image data for coding.

2. Description of the Related Art

During the 1990's in particular, the widespread use of PCs (personal computers) and other information equipment, the popularization of digital cameras, color printers and so forth and the explosive increase in the use of the Internet accounted for a deep infiltration of the culture of digital images into the everyday life of ordinary people. Under these circumstances, coding and compression technologies such as JPEG (Joint Photographic Experts Group) for static images and MPEG (Moving Picture Experts Group) for moving images, have been standardized so as to improve the facility of distribution and reproduction of images through recording media, such as CD-ROMs, and transmission media, such as networks and broadcasting waves.

In the JPEG series, JPEG 2000 using discrete wavelet transform (DWT) has been standardized in order to achieve further improvement of compression efficiency as well as to attain high image quality. DWT replaces discrete cosine transform (DCT) which conducts a filtering on the image on a block basis and plays an important role in the performance of compressing the image in JPEG 2000. In addition, in MPEG, the same wavelet transform is employed in texture compression.

Since the wavelet transform and the inverse wavelet transform require a large amount of calculations, certain methods are used in order to accelerate the calculations, for instance, the whole image is buffered for processing, or the image is divided into small regions of 128×128 pixel size called tiles and the image is buffered in a single unit of tile for processing. In addition, a method for storing and processing the image in a unit of line has been proposed.

Since the wavelet transform handles the whole image as a unit for the filtering process, the capacity of buffer necessary for the filtering process needs to be greatly increased. This problem becomes an obstacle to implementing the algorithm of JPEG 2000 from the aspect of cost. When the method for dividing the image into tiles is employed, a large image can be processed in a buffer with a small capacity, but some noise at the boundary of the tiles is inevitable and the image quality will degrade.

Even when the method using a line memory is employed, when a 9/7 filter is used for instance, the image must be extracted in lots of 9 lines and stored in the memory, and therefore the length of one line becomes about 1600 pixels in the case of a normal image and the capacity of line memory required is not small. As a matter of course, an image whose width exceeds the length of the line cannot be processed.

Moreover, the wavelet transform and the inverse transform must be configured as separate circuits in these methods and therefore the cost factor becomes large.

SUMMARY OF THE INVENTION

The present invention has been made with a view to the above-mentioned problems, and an object thereof is to provide an image transformation technology which can be realized at low cost.

According to one aspect of the present invention, an image transformation method for filtering image data is provided. The method comprises preserving an intermediate result of a pixel which has been filtered previously and then utilizing the intermediate result for a current filtering process, and thereby completing the current filtering process without relying on at least some part of the pixels which originally affected the current filtering process.

The filtering process conducted on the image data may be a two-dimensional wavelet transform in X and Y directions of the image, and the transform may comprise filtering one set of $N_a$ pixels arranged in Y direction and filtering another set of $N_a$ pixels which are located in a position shifted one pixel in X direction and arranged in Y direction after the filtering of a previous set is completed, and the number $N_a$ may be smaller than the number $N_b$ of pixels originally processed during the filtering in Y direction. When the two-dimensional discrete wavelet transform is realized using a 9/7 Daubechies filter, one pixel is affected by four pixels at the right and left sides. Therefore the number $N_b$ of dependent pixels is 9, however, the number $N_a$ of target pixels to be filtered may be smaller than 9, for instance, 2.

According to another aspect of the present invention, an image transformation apparatus is provided. The apparatus comprises a pixel buffer which stores a partial region of N pixels in X direction and M pixels in Y direction extracted from a frame buffer of an image, a Y filter which filters a set of target pixels arranged in Y direction in the pixel buffer, and a first register which preserves an intermediate result by the Y filter and forwards the intermediate result to the Y filter, and the intermediate result of a previous set of the target pixels by the Y filter is forwarded to the Y filter which filters a current set of the target pixels.

The apparatus may further comprise an X filter which receives a final result produced by the Y filter and filters a set of target pixels arranged in X direction in the pixel buffer, and a second register which stores an intermediate result produced by the X filter and forwards the intermediate result to the X filter, and the intermediate result of a previous set of the target pixels by the X filter is forwarded to the X filter which filters a current set of the target pixels and the X filter finally outputs a result of a two-dimensional filtering process conducted on the image. The X direction may be the horizontal direction of the image and the filtering process may be performed on a pair of two pixels arranged in the horizontal direction.

The Y filter and the X filter may be filters in a two-dimensional discrete wavelet transform. The filtering computation in the discrete wavelet transform is expressed as a recurrence formula and uses an intermediate output of the pixel recursively. For instance, in the case of the 9/7 filter, four intermediate results are stored in the register and used in the filtering computation of the next pair of pixels.

The numbers N and M may be respectively made independent from the numbers of pixels in X direction and Y direction which originally affected a filtering result from the set of the target pixels by the X filter and the Y filter, by means of utilizing the intermediate results produced by the X filter and the Y filter. Therefore the numbers N and M may be fixed values independent of the image size. The first and the second registers may be registers of a fixed length which store values of the intermediate results, the numbers of the values stored in the registers being respectively dependent on the numbers of pixels in X direction and Y direction which affect a filtering result from a set of the target pixels arranged in X direction and Y direction.

The Y filter may scan the pixel buffer in X direction and turn at an end of the pixel buffer in X direction and shift forward in Y direction, and a window of the pixel buffer may shift by M pixels in Y direction and new pixel data may be extracted in the shifted position after the Y filter completes scanning the data in the pixel buffer, and the Y filter may filter the new data in the pixel buffer. The X filter may filter a final processing result produced by the Y filter and thereby a two-dimensional filtering may be performed on the pixel buffer.

A window of the pixel buffer may be moved to a next position which is the same as the initial position in Y direction and is shifted by K pixels from the initial position in X direction when the filtering process reaches the end of the image in Y direction as a result of the window of the pixel buffer shifting in Y direction, and new data may be extracted in the next position and the Y filter may filter the new data in the pixel buffer. The X filter may filter a final processing result produced by the Y filter and thereby a two-dimensional filtering on the pixel buffer may be completed, and the two-dimensional filtering on the whole image may be performed by shifting the window of the pixel buffer and repeatedly performing the same filtering process.

The shift amount K in X direction of the window of the pixel buffer may be smaller than the length N in X direction of the pixel buffer. Namely, the width of the scanning column in Y direction is N, however, (N−K) pixels of the column may wrap over from the previous column. In particular, the value of K may be defined in such a manner that a number P, which is equal to (N−K), corresponds to the number of pixels in X direction which originally affected a processing result from the set of the target pixels. For instance, in the above-mentioned 9/7 filter, information from four previous pixels is needed at the left end of the window and therefore the number of pixels to be wrapped over from the previous column is four.

Moreover, any arbitrary replacement or substitution of the above-described structural components and the steps, expressions replaced or substituted in part or whole between a method and an apparatus as well as addition thereof, and expressions changed to a system, a computer program, recording medium or the like are all effective as and are encompassed by the present invention.

This summary of the invention does not necessarily describe all necessary features, so that the invention may also be a sub-combination of these described features.

DETAILED DESCRIPTION OF THE INVENTION

The invention will now be described by reference to the preferred embodiments. This does not intend to limit the scope of the present invention, but exemplify the invention.

Embodiment 1

Figure 1:
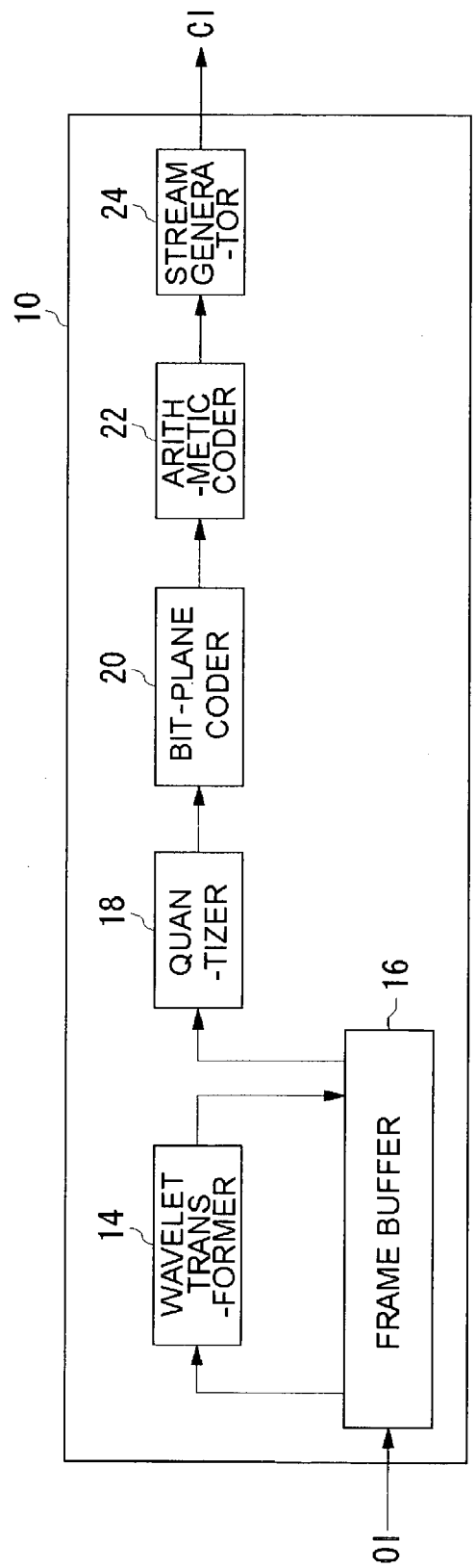
FIG. 1 is a block diagram showing a structure of an image coding apparatus according to Embodiment 1.

FIG. 1 shows the configuration of an image coding apparatus 10 according to Embodiment 1. The image coding apparatus 10 codes image data according to JPEG 2000. The specifications of JPEG 2000 are described in the standards document, ISO/IEC 15444-1: JPEG 2000 image coding system, JPEG 2000 Final Committee Draft, Aug. 18, 2000. The image coding apparatus 10 may be a normal computer and comprises a CPU, memory and program modules to code images loaded in the memory. The blocks in FIG. 1 depict functions characteristic of the present embodiment and those skilled in the art understand that the functional blocks can be embodied as hardware only, software only or as a combination of the two.

The image coding apparatus 10 comprises a wavelet transformer 14, a frame buffer 16, a quantizer 18, a bit-plane coder 20, an arithmetic coder 22 and a stream generator 24. An original image OI is read in the frame buffer 16 when the coding process starts. The image is input directly into the frame buffer 16 from a shooting apparatus such as a digital camera or input via a memory provided externally or internally.

The original image OI in the frame buffer 16 is hierarchized by the wavelet transformer 14. The wavelet transformer 14 in JPEG 2000 employs a Daubechies filter. The filter simultaneously works as a low-pass filter and a high-pass filter in x, y directions and divides the original image into four frequency sub-bands. The four sub-bands are: the LL sub-band which is composed of low frequency components in x and y directions, the HL and LH sub-bands which are composed of low frequency components in one of the x and y directions and high frequency components in the other direction, and the HH sub-band which is composed of high frequency components in x and y directions. The number of pixels in each sub-band image is half of those of the original image, respectively. The filtering process therefore renders four sub-band images, the sizes of which are one-fourth the size of the input image.

The wavelet transformer 14 conducts a filtering process on the rendered LL sub-band, which is divided into LL, HL, LH and HH sub-bands. By repeating the filtering process, the LL sub-band rendered in the final filtering is obtained as an image which is closest to the DC component of the original image OI. In the same layer, the LL sub-band contains low frequency components, and the HL, LH and HH sub-bands contain high frequency components. The previous layer rendered in the previous filtering process comprises four sub-bands in which high frequency components are more dominant than those rendered in the present filtering process.

Thereafter, although the detail is not described, the hierarchized image is input into the quantizer 18, the bit-plane coder 20, the arithmetic coder 22 and the stream generator 24 starting with the lowest frequency component, and the final coded image data CI are generated and output from the stream generator 24.

Figure 2:
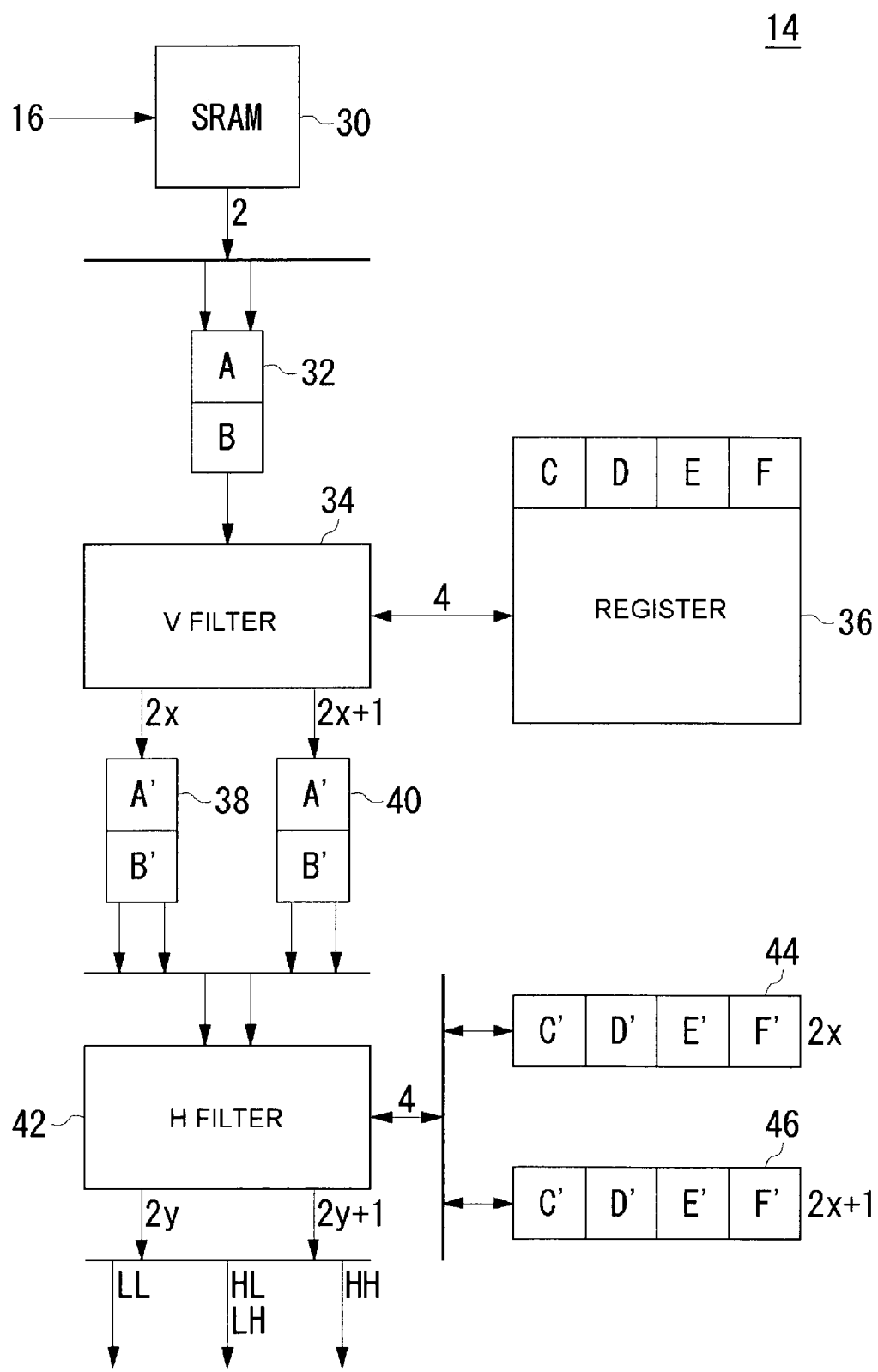
FIG. 2 is a block diagram of the wavelet transformer represented in FIG. 1.

FIG. 2 is a block diagram of the wavelet transformer 14, which is an example of an image transformation apparatus. An SRAM 30 functions as a pixel buffer which stores a partial region of the image data copied from the frame buffer 16. The copied image region is a region of N pixels in a horizontal direction (hereinafter referred to as H direction) and M pixels in a vertical direction (hereinafter referred to as V direction), which is called a window.

V filter 34 reads a pair 32 of two target pixels A and B arranged in V direction from the SRAM 30 and performs a V directional filtering process in a discrete wavelet transform on the pair 32 of these target pixels A and B. In this filtering process, the V filter 34 utilizes four intermediate results C, D, E and F stored in a register 36. The four intermediate results C, D, E and F stored in the register 36 are the values of the filtered pixels obtained as intermediate results when the V filter 34 has performed a filtering process on a previous pair of pixels one step before the filtering process was performed on the pair 32 of the target pixels A and B. The V filter 34 performs the filtering process on the pair 32 of target pixels A and B by multiplication and addition of the values of the pair 32 of target pixels A and B and the values of the intermediate results C, D, E and F, and then forwards its intermediate results to the register 36. The written intermediate results are then utilized in the filtering process on the next target pixels.

The V filter 34 scans the pair 32 of the target pixels A and B pixel by pixel in H direction in the SRAM 30 and performs the filtering process and then outputs the transformed results A' and B' from the pair 32 of the target pixels A and B to H filter 42. The H filter 42 receives from the V filter 34 the first pair 38 of the transformed target pixels A' and B' and the second pair 40 of the transformed target pixels A' and B'. The first pair 38 and the second pair 40 are the transformed results continuously output after being sequentially filtered in the H directional scanning pixel by pixel performed by the V filter 34.

The H filter 42 receives the four pixels that consist of the first pair 38 and the second pair 40, and extracts every pair of pixels in H direction and then performs H directional filtering. This filtering process is the same as the V directional filtering conducted by V filter 34 except that the direction is different. The H filter 42 filters the first line of the four pixels input from the V filter 34 utilizing the four intermediate results C', D', E' and F' stored in a register 44, and then filters the second line of the four pixels utilizing the four intermediate results C', D', E' and F' stored in another register 46.

The filtering result produced by the H filter 42 is successively output as a unit of four pixels, and this unit of four pixels form the wavelet transform coefficients LL, HL, LH and HH. Therefore, by gathering the wavelet transform coefficients LL, HL, LH and HH output as a unit of four pixels for each sub-band, the four sub-band images LL, HL, LH and HH can be obtained as a final transformed result.

Figure 3:
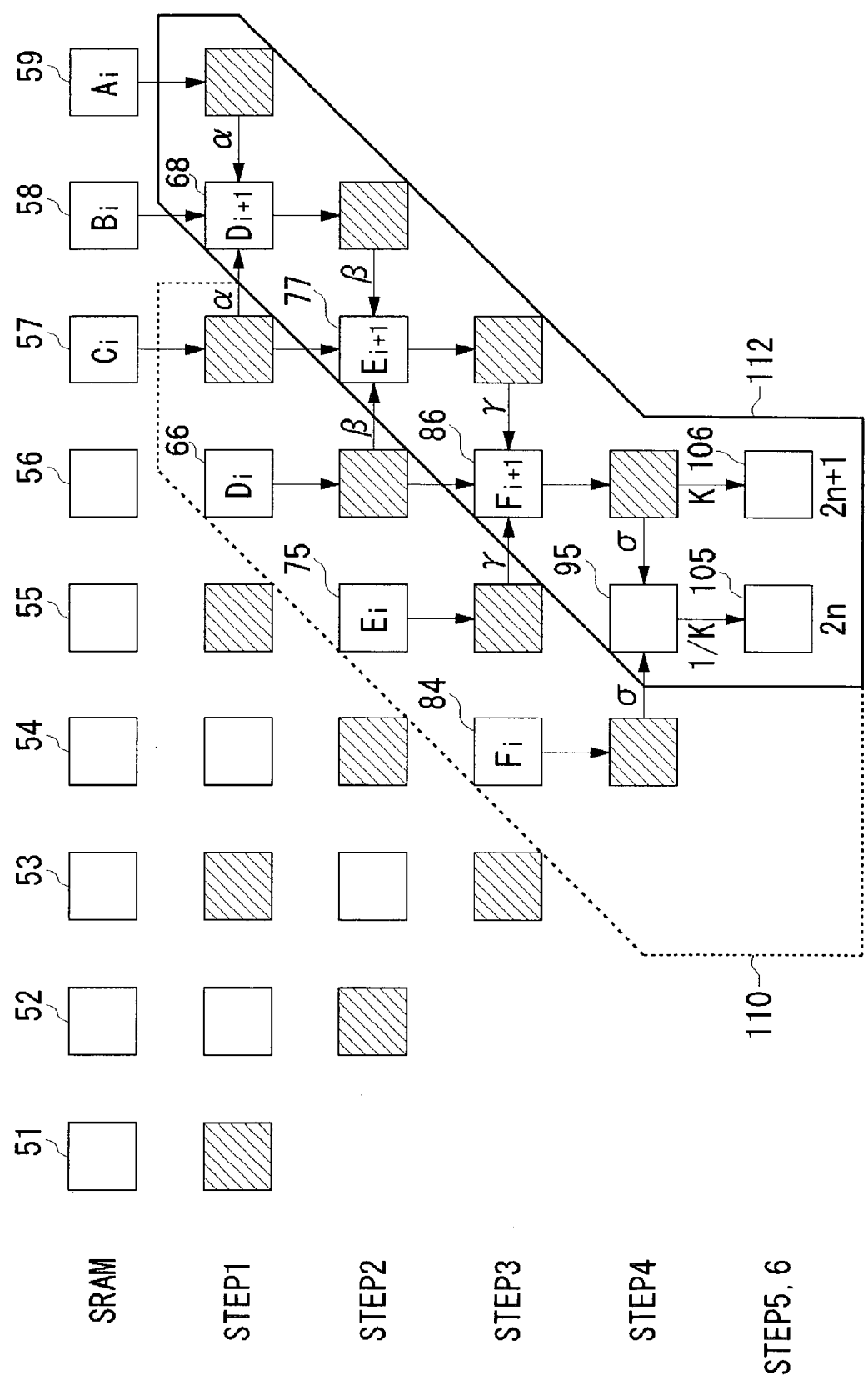
FIG. 3 illustrates a computational algorithm by a 9/7 filter in the wavelet transformer represented in FIG. 2.

FIG. 3 illustrates the computational algorithm of the filtering process conducted by V filter 34. This figure shows how 9 pixels 51 to 59 buffered in the SRAM 30 are transformed by the computation of Steps 1 to 6, in the case of a 9/7 filter used in the discrete wavelet transform. For the convenience of this explanation, the pixels are depicted in the horizontal direction, however, the pixels are actually arranged in the vertical direction in the case of the filtering process conducted by the V filter 34. In the 9/7 filter, the central pixel 55 in the figure is affected by four pixels at the right side and four pixels at the left side in the filtering process. In the figure, the shaded pixels indicate that their values are inherited from the upper pixels and the other pixels indicate that the intermediate values transformed by a transformation formula at the previous step are stored. This transformation is performed by means of a recurrence formula described later and has a property that the intermediate outputs of the pixels are recursively used. Therefore by storing the intermediate results temporarily, their reuse becomes possible in the computation of the subsequent pixels.

The transformation of a pair of the i-th target pixels $A_i$ 59 and $B_i$ 58 will now be explained. The V filter 34 reads from the register 36 four intermediate results $C_i$ 57, $D_i$ 66, $E_i$ 75 and $F_i$ 84 which are obtained in the transformation of the (i−1)th pair of the pixels, and utilizes them in the transformation of the pair of the i-th target pixels $A_i$ 59 and $B_i$ 58.

At Step 1, the values of $B_i$ 58, and $C_i$ 57 multiplied by α, and $A_i$ 59 multiplied by α are added and thereby an intermediate result $D_{i+1}$ 68 to be used in the (i+1)th transformation is calculated.

At Step 2, the values of $C_i$ 57, and $D_i$ 66 multiplied by β, and $D_{i+1}$ 68 multiplied by β are added and thereby an intermediate result $E_{i+1}$ 77 to be used in the (i+1)th transformation is calculated.

At Step 3, the values of $D_i$ 66, and $E_i$ 75 multiplied by γ, and $E_{i+1}$ 77 multiplied by γ are added and thereby an intermediate result $F_{i+1}$ 86 to be used in the (i+1)th transformation is calculated.

At Step 4, the values of $E_i$ 75, and $F_i$ 84 multiplied by δ, and $F_{i+1}$ 86 multiplied by δ are added and thereby an intermediate result 95 is calculated.

At Step 5, the intermediate result $F_{i+1}$ 86 obtained at Step 3 is multiplied by K and thereby a pixel 106 is obtained. This pixel 106 is a final transformation result from the (2n+1)th pixel 56 in the pixel buffer.

At Step 6, the intermediate result 95 obtained at Step 4 is multiplied by (1/K) and thereby a pixel 105 is obtained. This pixel 105 is a final transformation result from the 2n-th pixel 55 in the pixel buffer.

The target pixel $A_i$ 59 is used as an intermediate result $C_{i+1}$ in the (i+1)-th transformation process. Thus the four intermediate results $C_{i+1}$, $D_{i+1}$, $E_{i+1}$ and $F_{i+1}$ obtained in the i-th transformation process are utilized in the (i+1)-th transformation of a pair of two target pixels $A_{i+1}$ and $B_{i+1}$. In the i-th transformation process, a range 112 surrounded by a solid line is filtered and a final transformation result and the intermediate results to be used next are generated. The transformation has a recursive structure in which the intermediate results obtained in the previous filtering of a range 110 surrounded by a dotted line are reused in the current filtering.

Thus the V filter 34 transforms a pair of the 2n-th pixel 55 and the (2n+1)-th pixel 56 in V direction and then outputs a pair of the transformed pixels 105 and 106. Since the 2n-th pixel 55 is affected by four pixels at the right and left sides respectively in the 9/7 filter, 9 pixels in total must be filtered originally. However, according to the recursive nature of the filtering computation, the present embodiment stores the four intermediate results in the register 36 and reuses them, and thereby performs the filtering computation only on the pair of two target pixels.

In FIG. 3, since no previous four pixels to be used for the pixels at the left end of the image yet exist, the filtering calculation cannot be performed. Therefore, for the pixels at the left end, the subsequent four pixels at the right side are copied to the left side so as to maintain symmetry with respect to the pixels at the left end. Likewise, for the pixels at the right end, the next four pixels at the left side are copied to the right side. Thereby four pixels are added at the right and left sides respectively. The data having the additional pixel data at the right and left sides are called extended pixel data.

Figure 4:
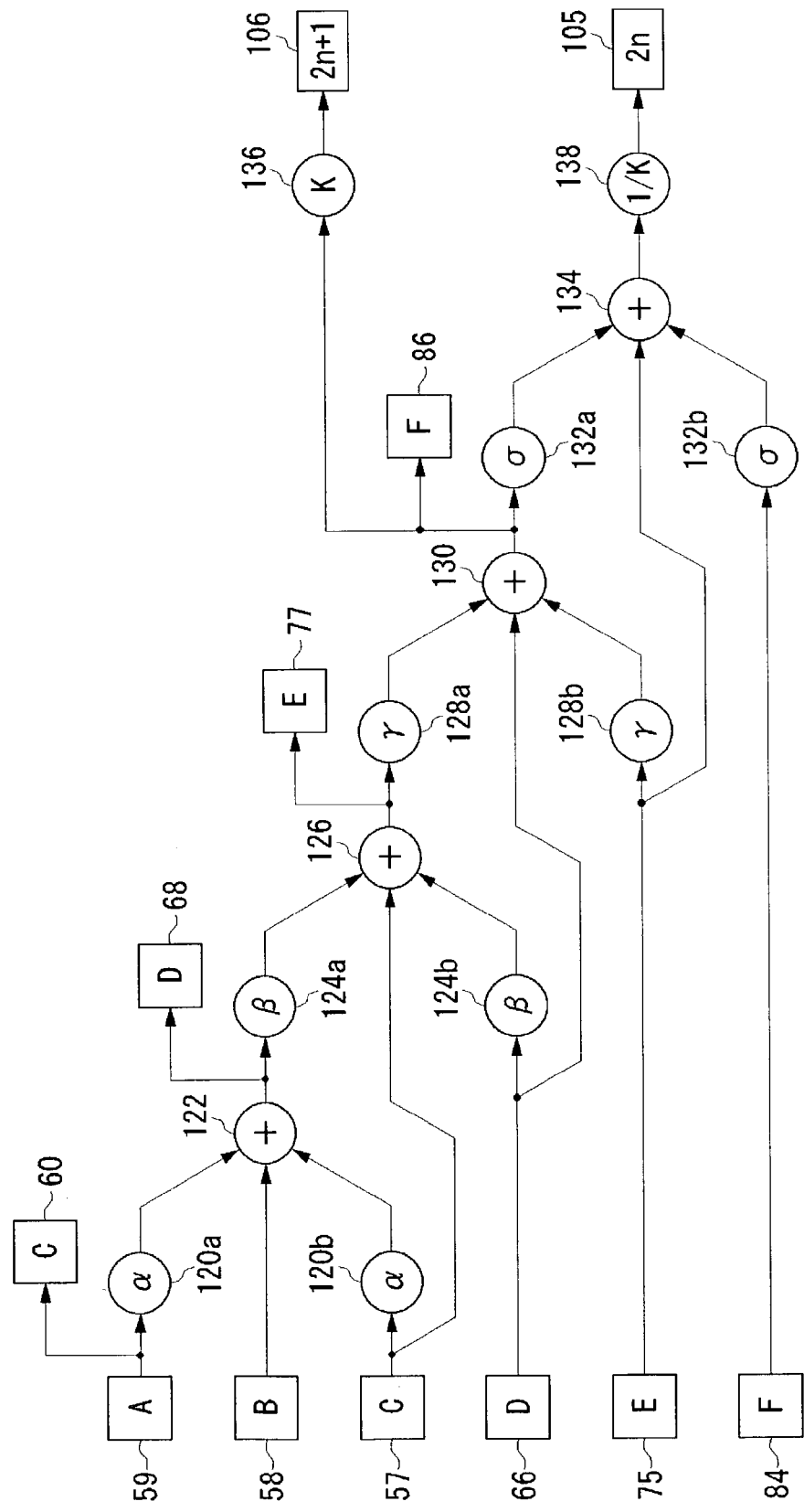
FIG. 4 illustrates a flow of the filtering calculation shown in FIG. 3.

FIG. 4 illustrates the flow of this filtering calculation. A pixel value A 59 is directly used as a pixel value 60 in the next calculation, and it is also multiplied by a multiplier 120a with a factor of α and input into the first adder 122. A pixel value B 58 is directly input into the first adder 122. A pixel value C 57 is multiplied by a multiplier 120b with a factor of α and input into the first adder 122. The first adder 122 adds the input values and outputs the result. This calculation corresponds to Step 1 of FIG. 3.

The output from the first adder 122 is directly used as a pixel value D 68 in the next calculation, and it is also multiplied by a multiplier 124a with a factor of β and input into the second adder 126. The pixel value C 57 is directly input into the second adder 126, and a pixel value D 66 is multiplied by a multiplier 124b with a factor of β and input into the second adder 126. The second adder 126 adds the input values and outputs the result. This calculation corresponds to Step 2 of FIG. 3.

The output from the second adder 126 is directly used as a pixel value E 77 in the next calculation, and it is also multiplied by a multiplier 128a with a factor of γ and input into the third adder 130. The pixel value D66 is directly input into the third adder 130, and a pixel value E75 is multiplied by a multiplier 128b with a factor of γ and input into the third adder 130. The third adder 130 adds the input values and outputs the result. This calculation corresponds to Step 3 of FIG. 3.

The output from the third adder 130 is directly used as a pixel value F 86 in the next calculation, and it is also multiplied by a multiplier 132a with a factor of δ and input into the fourth adder 134. The pixel value E 75 is directly input into the fourth adder 134, and a pixel value F 84 is multiplied by a multiplier 132b with a factor of δ and input into the fourth adder 134. The fourth adder 134 adds the input values and outputs the result. This calculation corresponds to Step 4 of FIG. 3.

The output from the third adder 130 is multiplied by a multiplier 136 with a factor of K and becomes a transformation result 106 of the (2n+1)-th target pixel. This calculation corresponds to Step 5 of FIG. 3. The output from the fourth adder 134 is multiplied by a factor of (1/K) and becomes a transformation result 105 of the 2n-th target pixel. This calculation corresponds to Step 6 of FIG. 3.

The recurrence formula of this filtering calculation will now be explained. The 2n-th pixel value is denoted by $X_{ext}(2n)$, the transformed pixel value is denoted by $Y(2n)$ and so on. The transformed pixel value means either the value of the intermediate result or the value of the final result. Herein $X_{ext}(2n)$ is the extended data of the original image data $X(2n)$ as described above.

Transformation Formula of Step 1:

$$Y(2n+3)=X_{ext}(2n+3)+\alpha^*(X_{ext}(2n+2)+X_{ext}(2n+4))$$

Transformation Formula of Step 2:

$$Y(2n+2)=X_{ext}(2n+2)+\beta^*(Y(2n+1)+Y(2n+3))$$

Transformation Formula of Step 3:

$$Y(2n+1)=Y(2n+1)+\gamma^*(Y(2n)+Y(2n+2))$$

Transformation Formula of Step 4:

$$Y(2n)=Y(2n)+\delta^*(Y(2n-1)+Y(2n+1))$$

Transformation Formula of Step 5:

$$Y(2n+1)=K^*Y(2n+1)$$

Transformation Formula of Step 6:

$$Y(2n)=(1/K)^*Y(2n)$$

Herein the constants α, β, γ, δ band K are given in the above-mentioned standard document of JPEG 2000 and their rough values are as follows: α=−1.586134342, β=−0.052980119, γ=0.882911076, δ=0.443506852, K=1.230174105.

In the case of the H filter 42, the direction of the target pixels becomes H direction, however, the filtering calculation is essentially the same. However, two transformation results produced by V filter 34 have to be input for the H directional filtering. Therefore the H filter 42 waits until the process conducted by the V filter 34 has taken two steps. After obtaining the transformation result from four pixels from the V filter 34, the H filter 42 performs the filtering process. Two H filters may be provided in parallel so that the four pixels can be divided in two in H direction and processed at the same time.

Figure 5:
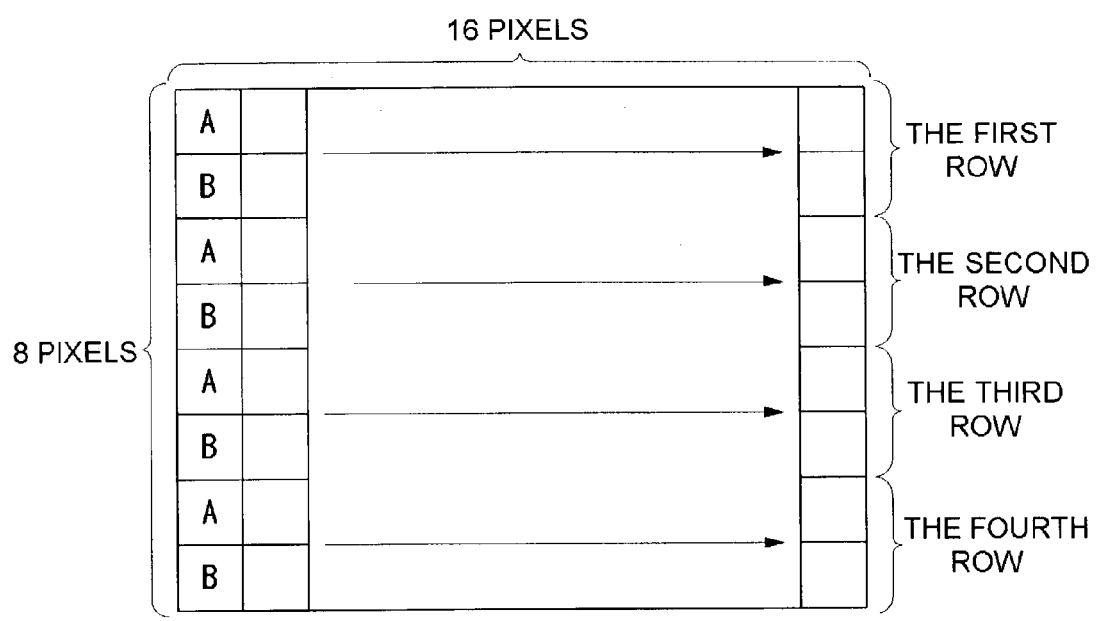
FIG. 5 illustrates a direction of scanning pixels in a pixel buffer.

The direction in which the image is scanned by the V filter 34 will now be explained. FIG. 5 shows the direction of scanning the pair of target pixels A and B in the partial image region stored in the SRAM 30. As an example, the SRAM 30 buffers the image region of 16 pixels in H direction and 8 pixels in V direction. As an example of the horizontal pixel number N and the vertical pixel number M, the case of N=16 and M=8 is herein explained, however, N may be 8 and M may be either 2, 4, 6 or 8.

The pair of target pixels A and B in V direction are scanned and read in H direction and thus the V directional filtering process is successively performed on the first row. The four intermediate results C, D, E and F are successively recorded in the register 36. The second line is scanned likewise and the two target pixels A and B are filtered. In this filtering, the intermediate results C, D, E and F of the first row are used. In addition, the intermediate results C, D, E and F in the filtering of the second row are overwritten in the register 36 so as to be used in the filtering of the third row. Likewise, the filtering process of the third and the fourth rows proceeds. It is to be noted that the H directional filtering conducted by the H filter 42 also proceeds based on the results output from the V filter 34 during the V directional filtering process conducted by the V filter 34 on each row. Thus, the V directional and H directional filtering processes are completed in the pixel buffer stored in the SRAM 30.

Figure 6:
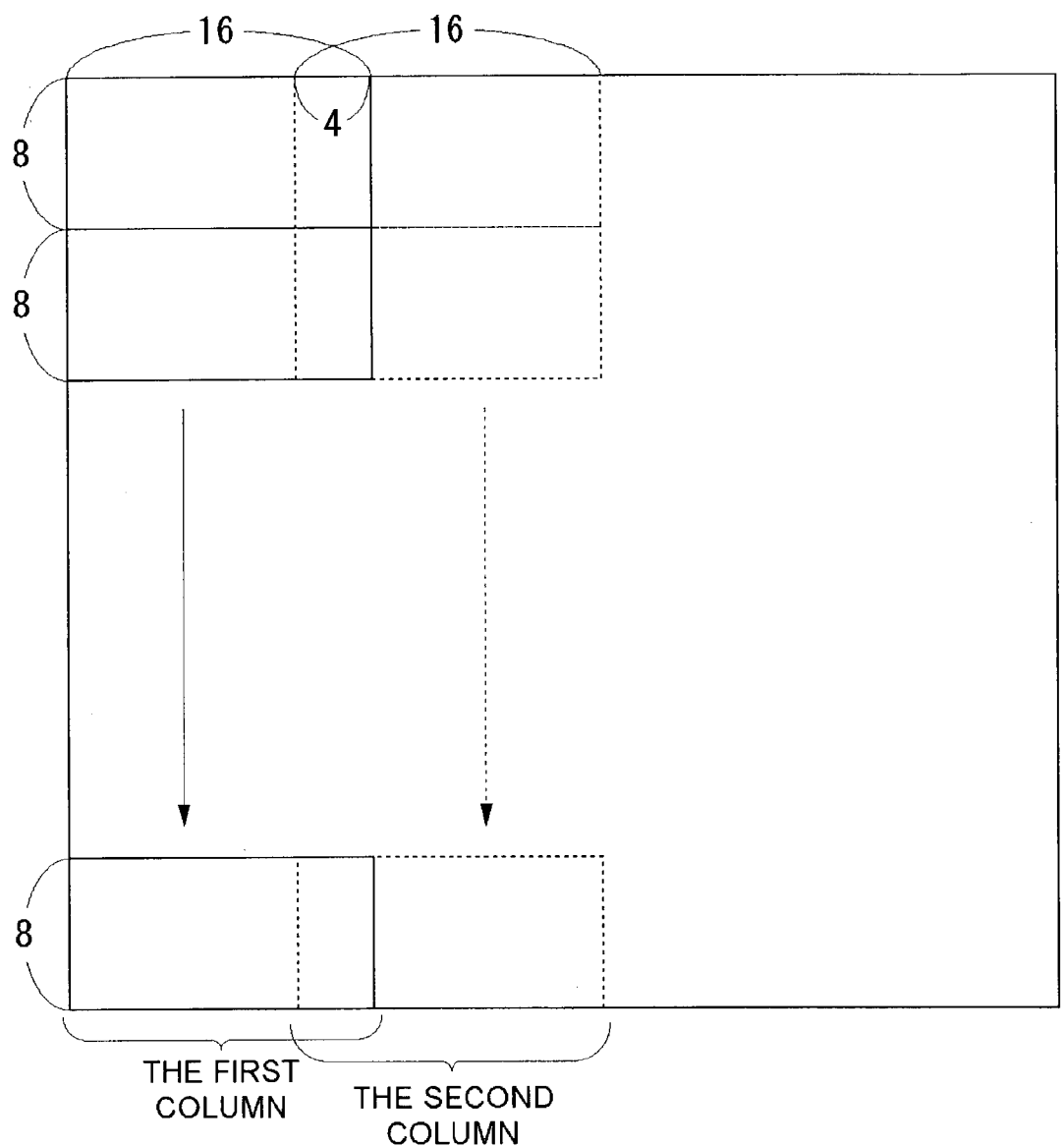
FIG. 6 illustrates a direction of shifting a window of a pixel buffer.

FIG. 6 illustrates the shifting direction of the window of the pixel buffer. The partial region of 16 pixels in H direction and 8 pixels in V direction shown in FIG. 5, is extracted from the upper-left region of the image in the frame buffer 16 and buffered in the SRAM 30. The filtering process is performed within the pixel buffer by the scanning method described in FIG. 5. Once the process in the pixel buffer ends, the window of the pixel buffer shifts by 8 pixels in V direction and another partial region of the same size is extracted and buffered in the SRAM 30, and then the same filtering process is performed on the new pixel buffer. In filtering the first row of the new pixel buffer, the intermediate result of the filtering process on the fourth row of the previous pixel buffer is utilized and therefore dependence is properly handled at the boundary of the pixel buffer and no noise arises at the boundary. Thus, the filtering process is repeated while the pixel buffer is shifted each time by 8 pixels in V direction, and when the filtering process reaches the lowest end of the image, the processing of the first column ends.

Next, the window is moved to a position that is the same as the initial position in V direction and is shifted by 12 pixels in H direction from the initial position, and then the processing of the second column proceeds in the same manner. Herein, the second column wraps over into the first column by four pixels. Since one pixel is affected by next four pixels on the right and left sides in the 9/7 filter, the left end of the window needs information from four pixels from the previous pixel buffer. As described above, since the intermediate results stored in the register 36 can be reused within the window, the filtering process can be performed without obtaining information from the four adjacent pixels. However, since no information from the four adjacent pixels is present at the left end of the window, the information from the four pixels must be obtained from the window of the first column.

Thus, the processing of each column is performed while the four pixels are wrapped over in H direction, and the filtering processes in both V direction and H direction are eventually completed on the whole image.

Embodiment 2

In Embodiment 2, a 5/3 filter is used instead of the 9/7 filter in Embodiment 1. The other structures are the same as in Embodiment 1. The filtering process is performed on a pair of target pixels as in the 9/7 filter, however, only two intermediate results are used in the 5/3 filter and the register 36 preserves the two intermediate results.

Figure 7:
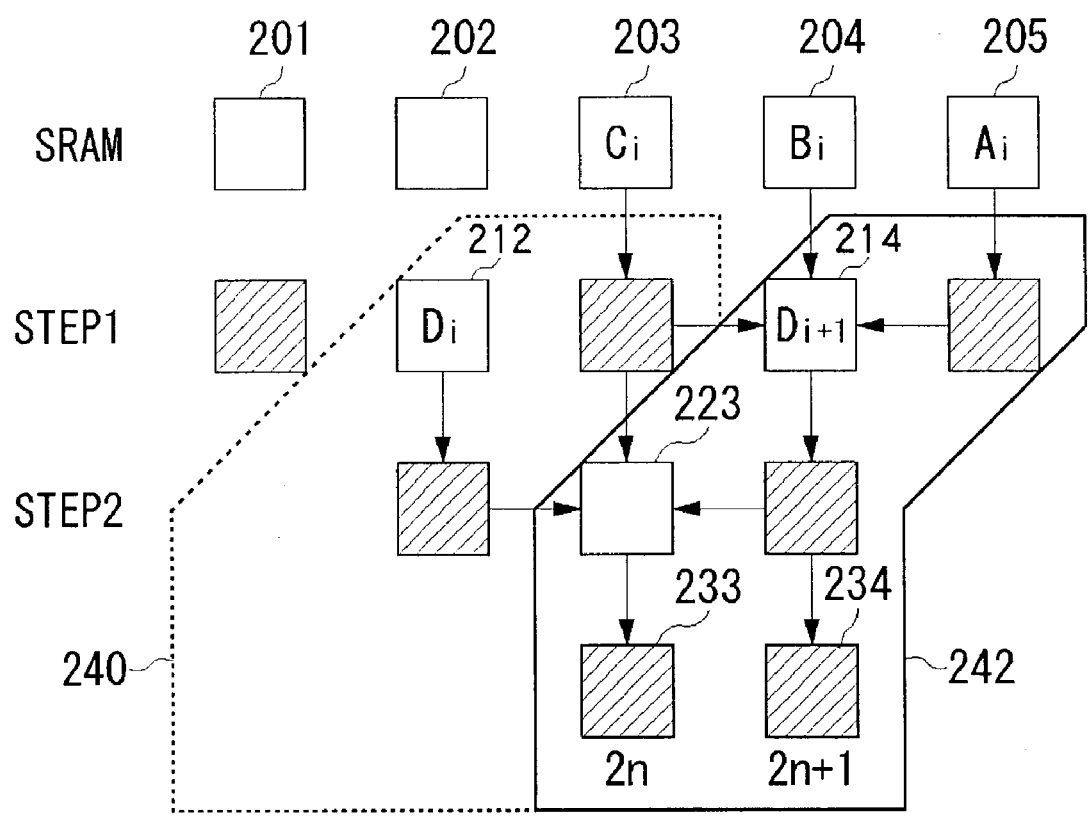
FIG. 7 illustrates a filtering calculation by a 5/3 filter in a wavelet transformer of an image coding apparatus according to Embodiment 2.

FIG. 7 illustrates the flow of this filtering calculation performed by the 5/3 filter. The figure shows how five pixels 201 to 205 buffered in the SRAM 20 are transformed in the computation of Step 1 and Step 2. In the 5/3 filter, the central pixel 203 is affected by two pixels at the right and left sides in the filtering process. As in FIG. 3, the shaded pixels indicate that their values are inherited from the upper pixels and the other pixels indicate that the intermediate values transformed by a transformation formula at the previous step are stored.

The recurrence formula of this filtering calculation performed by the 5/3 filter is shown below.

Transformation Formula of Step 1:

$$Y(2n+1)=X_{ext}(2n+1)-\text{floor}[(X_{ext}(2n)+X_{ext}(2n+2))/2]$$

Transformation Formula of Step 2:

$$Y(2n)=X_{ext}(2n)+\text{floor}[(Y(2n-1)+Y(2n+1)+2)/4]$$

Herein floor[x] is a floor function which outputs the largest integer that does not exceed the input value x.

The transformation of a pair of the i-th target pixels $A_i$ 205 and $B_i$ 204 will now be explained. Two intermediate results $C_i$ 203 and $D_i$ 212 obtained in the transformation of the (i−1)th pair of the pixels are read from the register 36, and utilized in the transformation of the pair of the i-th target pixels $A_i$ 205 and $B_i$ 204.

At Step 1, an intermediate result $D_{i+1}$ 214 to be used in the (i+1)-th transformation is calculated by the above-mentioned transformation formula of Step 1 using the values of $B_i$ 204, $C_i$ 203 and $A_i$ 205.

At Step 2, an intermediate result 223 to be used in the (i+1)-th transformation is calculated by the above-mentioned transformation formula of Step 2 using the values of $C_i$ 203, $D_i$ 212 and $D_{i+1}$ 214.

The intermediate result $D_{i+1}$ 214 at Step 1 is output as a final transformation result 234 from the (2n+1)-th pixel 204 in the pixel buffer. The intermediate result 223 at Step 2 is output as a final transformation result 233 from the 2n-th pixel 203 in the pixel buffer.

The target pixel $A_i$ 205 is used as an intermediate result $C_{i+1}$ in the (i+1)-th transformation process. Thus the two intermediate results $C_{i+1}$ and $D_{i+1}$ obtained in the i-th transformation process are utilized in the (i+1)-th transformation of a pair of two target pixels $A_{i+1}$ and $B_{i+1}$. In the i-th transformation process, a range 242 surrounded by a solid line is filtered and a final transformation result and the intermediate results to be used next are generated. The transformation has a recursive structure in which the intermediate results obtained in the previous filtering of a range 240 surrounded by a dotted line are reused in the current filtering.

Thus the V filter 34 transforms a pair of the 2n-th pixel 203 and the (2n+1)-th pixel 204 in V direction and then outputs a pair of the transformed pixels 233 and 234. Since the 2n-th pixel 203 is affected by two pixels at the right and left sides respectively in the 5/7 filter, 5 pixels in total must be filtered originally. However, according to the recursive nature of the filtering computation, the present embodiment stores the two intermediate results in the register 36 and reuses them, and thereby performs the filtering computation only on the pair of two target pixels.

Figure 8:
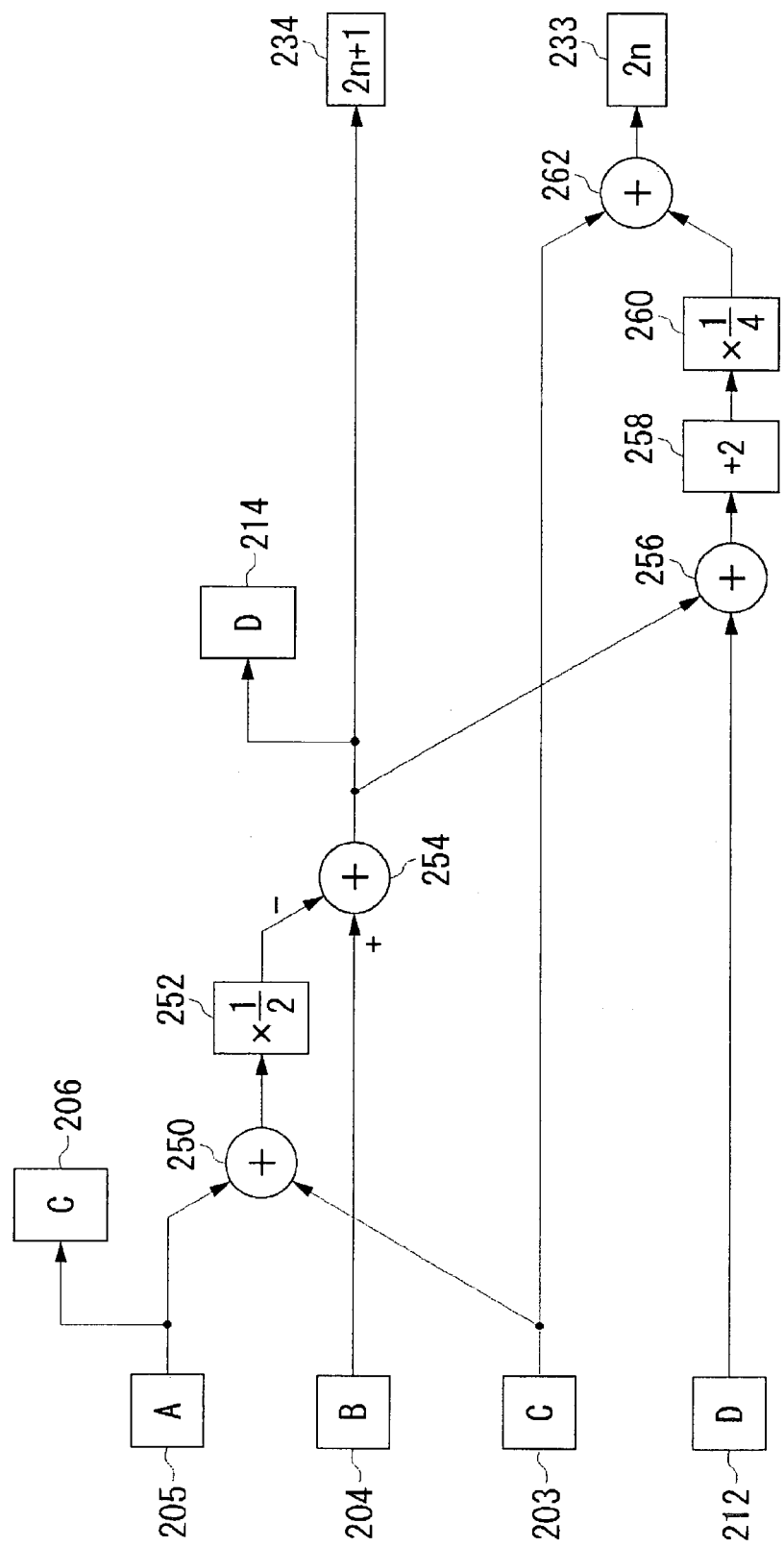
FIG. 8 illustrates the flow of the filtering calculation shown in FIG. 7.

FIG. 8 illustrates the flow of this filtering calculation. A pixel value A 205 is directly used as a pixel value 206 in the next calculation, and it is also input into the first adder 250. A pixel value C 203 is also input into the first adder 250. The first adder 250 adds the input values and its output is multiplied by a multiplier 252 with a factor of ½. The multiplier 252 also performs the calculation of the floor function on the multiplied result and outputs the result obtained by the floor function. The sign of the output value is inverted between positive and negative and then input into the second adder 254. A pixel value B 204 is input into the second adder 254. The second adder 254 adds the input values and outputs the result. This calculation corresponds to Step 1.

The output from the second adder 254 is directly used as a pixel value D 214 in the next calculation, and it also becomes a transformation result 234 of the (2n+1)-th target pixel. The output from the second adder 254 is input into the third adder 256. A pixel value D 212 is also input into the third adder 256. The third adder 256 adds the input values, and its output is added by 2 by a adder 258 and then multiplied by a multiplier 260 with a factor of ¼. The multiplier 260 also performs the calculation of the floor function on the multiplied result and outputs the result obtained by the floor function. The output value is input into the fourth adder 262. A pixel value C 203 is input into the fourth adder 262. The fourth adder 262 adds the input values and outputs the result. This calculation corresponds to Step 2. The output from the fourth adder 262 becomes a transformation result 233 of the 2n-th target pixel.

As described above, by using the register of a fixed length which temporarily stores the intermediate results in the filtering computation of the discrete wavelet transform, the embodiments can scan the image as a unit of a block of N×M pixels and perform the wavelet transform on the whole image. Since the size of the pixel buffer does not depend on the image size and is fixed, a line memory or an image buffer with a large capacity is not necessary for the filtering process. Since the configuration does not depend on image size, images ranging from low resolution to high resolution can be handled uniformly without changing the circuit configuration and therefore the process is applicable to wide use. In addition, since it is not necessary to divide the image into tiles, no boundary noise arises even when the compression ratio is increased and therefore the image quality does not degrade.

Furthermore, a similar filtering computation using the intermediate results can be applied to the inverse wavelet transform and the filtering process of the inverse transform can be performed using a pixel buffer of a fixed size. Therefore the circuit configuration can be shared in the wavelet transform and the inverse transform and can be implemented at a low cost.

Although the present invention has been described by way of exemplary embodiments, it should be understood that many changes and substitutions may be made by those skilled in the art without departing from the spirit and the scope of the present invention which is defined only by the appended claims. Such changes and substitutions may be provided as follows.

In the embodiments, the V filter 34 and the H filter 42 in this order sequentially filter the pixel data stored in the SRAM 30, however, the apparatus may be so configured that the pixel data from the SRAM 30 can be input into the H filter 42 and the V filter 34 in this order and the V directional filtering can be performed after the H directional filtering. Moreover, the filtering computation of the wavelet transform is explained in the embodiments, however, a similar computation using the intermediate results can be performed in the inverse transform.

What is claimed is:

1. An image transformation method for filtering image data comprising preserving an intermediate result of a pixel which has been filtered previously and then utilizing the intermediate result for a current filtering process, and thereby completing the current filtering process without relying on at least a part of pixels which originally affected the current filtering process, wherein the filtering conducted on the image data is a two-dimensional wavelet transform in X and Y directions of the image, and the transform comprises filtering one set of a $N_a$ pixels arranged in Y direction and filtering another set of $N_a$ pixels which are located in a position shifted one pixel in X direction and arranged in Y direction after the filtering of a previous set is completed, and wherein the number $N_a$ is smaller than the number of pixels originally dependent in the filtering in Y direction.

2. An image transformation apparatus comprising:
a pixel buffer which stores a partial region of N pixels in X direction and M pixels in Y direction extracted from a frame buffer of an image;
a Y filter which filters a set of target pixels arranged in Y direction in the pixel buffer; and
a first register which temporarily stores an intermediate result by the Y filter and forwards the intermediate result to the Y filter,
and wherein the intermediate result of a previous set of the target pixels in an image by the Y filter is forwarded to the Y filter which filters a current set of target pixels in the image.

3. The apparatus of claim 2, further comprising:
an X filter which receives a final result produced by the Y filter and filters a set of target pixels arranged in X direction in the pixel buffer; and
a second register which temporarily stores an intermediate result by the X filter and forwards the intermediate result to the X filter,
and wherein the intermediate result of a previous set of target pixels produced by the X filter is forwarded to the X filter which filters a current set of target pixels and the X filter finally outputs a result of a two-dimensional filtering process on the image.

4. The apparatus of claim 3, wherein the Y filter and the X filter are filters in a two-dimensional discrete wavelet transform, and intermediate outputs of a recurrence formula for filtering a set of the target pixels are stored in the first and the second registers and are utilized as inputs into the recurrence formula of filtering a subsequent set of target pixels.

5. The apparatus of claim 4, wherein the numbers N and M are respectively made independent of the numbers of pixels in X direction and Y direction which originally affected a filtering result of the set of the target pixels produced by the X filter and the Y filter, by means of utilizing the intermediate results from the X filter and the Y filter.

6. The apparatus of claim 5, wherein the first and the second registers are registers of a fixed length which store values of the intermediate results, the numbers of the values stored in the registers being respectively dependent on the numbers of pixels in X direction and Y direction which affect a filtering result from a set of target pixels arranged in X direction and Y direction.

7. The apparatus of claim 3, wherein the numbers N and M are respectively made independent of the numbers of pixels in X direction and Y direction which originally affected a filtering result from the set of the target pixels produced by the X filter and the Y filter, by means of utilizing the intermediate results from the X filter and the Y filter.

8. The apparatus of claim 7, wherein the first and the second registers are registers of a fixed length which store values of the intermediate results, the numbers of the values stored in the registers being respectively dependent on the numbers of pixels in X direction and Y direction which affect a filtering result from a set of target pixels arranged in X direction and Y direction.

9. The apparatus of claim 3, wherein the Y filter scans the pixel buffer in X direction and turns at an end of the pixel buffer in X direction and shifts forward in Y direction, and a window of the pixel buffer shifts by M pixels in Y direction and new pixel data are extracted in the shifted position after the Y filter completes scanning the data in the pixel buffer, and the Y filter filters the new data in the pixel buffer.

10. The apparatus of claim 9, wherein the X filter filters a final processing result produced by the Y filter and thereby a two-dimensional filtering on the pixel buffer is performed.

11. The apparatus of claim 9, wherein a window of the pixel buffer is moved to a next position which is the same as an initial position in Y direction and is shifted by K pixels from the initial position in X direction when the filtering process reaches the end of the image in Y direction as a result of the window of the pixel buffer shifting in Y direction, and new data are extracted in the next position and the Y filter filters the new data in the pixel buffer.

12. The apparatus of claim 11, wherein the X filter filters a final processing result produced by the Y filter and thereby a two-dimensional filtering on the pixel buffer is completed, and the two-dimensional filtering on the whole image is performed by shifting the window of the pixel buffer and performing the same filtering process repeatedly.

13. The apparatus of claim 9, wherein the number K of pixels shifted in X direction is defined in such a manner that a number P, which is equal to (N−K), N being a number of pixels in X direction of the pixel buffer, corresponds to the number of pixels in X direction which originally affected a processing result of the set of the target pixels.

* * * * *